United States Patent
Danielsson

(10) Patent No.: US 6,586,742 B2
(45) Date of Patent: Jul. 1, 2003

(54) METHOD AND ARRANGEMENT RELATING TO X-RAY IMAGING

(76) Inventor: Mats Danielsson, Rösvägen 12, SE-187 43 Täby (SE)

( * ) Notice: Subject to any disclaimer, the term of this patent is extended or adjusted under 35 U.S.C. 154(b) by 0 days.

(21) Appl. No.: 10/090,266

(22) Filed: Mar. 1, 2002

(65) Prior Publication Data

US 2002/0117626 A1 Aug. 29, 2002

Related U.S. Application Data

(63) Continuation of application No. PCT/SE01/01609, filed on Jul. 10, 2001.
(60) Provisional application No. 60/217,643, filed on Jul. 10, 2000.

(30) Foreign Application Priority Data

Jul. 10, 2000 (SE) .............................................. 0002612

(51) Int. Cl.[7] .................................................. G01T 7/00
(52) U.S. Cl. .............................. 250/370.01; 250/370.08
(58) Field of Search ....................... 250/370.01, 370.09, 250/370.13, 370.14, 484.4, 581, 591; 257/428, 429; 378/79, 901

(56) References Cited

U.S. PATENT DOCUMENTS

| | | | | |
|---|---|---|---|---|
| 4,618,380 A | * | 10/1986 | Alcorn et al. ................ | 148/187 |
| 4,937,453 A | * | 6/1990 | Nelson .................... | 250/370.09 |
| 5,117,114 A | * | 5/1992 | Street et al. ............ | 250/370.11 |
| 5,156,810 A | * | 10/1992 | Ribi ........................ | 422/82.01 |
| 5,354,982 A | | 10/1994 | Nelson et al. ......... | 250/214 LA |
| 5,627,377 A | * | 5/1997 | Hamilton, Jr. et al. .. | 250/370.13 |
| 5,665,969 A | * | 9/1997 | Beusch ................... | 250/370.09 |

FOREIGN PATENT DOCUMENTS

EP 0767389 A2 9/1997

* cited by examiner

*Primary Examiner*—Constantine Hannaher
*Assistant Examiner*—Otilia Gabor
(74) *Attorney, Agent, or Firm*—Oppedahl & Larson LLP

(57) ABSTRACT

The present invention relates to a method and arrangement for detecting substantially the entire signal from a photon converting in a detector in an x-ray detecting arrangement (200, 300, 400), which results in charge-sharing, said arrangement comprising a number of spaced apart sensors (220, 320, 420), said detected photons indirectly creating an amount of free charges proportional to the photon energy. The method comprises the steps of arranging a blocking means (230, 330, 430) between said spaced apart sensors for stopping x-rays that will be incident close to edges of said sensors and will give rise to charge sharing between adjacent sensors. The blocking means comprises etched layers composed together to a blocking layer. The arrangement comprising said blocking means.

18 Claims, 2 Drawing Sheets

METHOD AND ARRANGEMENT RELATING TO X-RAY IMAGING

This application is a continuation of PCT/SE01/01609 filed Jul. 10, 2001 designating the United States, and claims priority from U.S. Provisional Application No. 60/217,643 filed Jul. 10, 2000, each of which is incorporated herein by reference.

TECHNICAL FIELD OF INVENTION

The present invention relates to a method and arrangement to detect the entire signal from any photon converting in a detector in an x-ray detecting arrangement comprising a number of spaced apart sensors, said detected photons indirectly creating an amount of free charges proportional to the photon energy.

BACKGROUND OF THE INVENTION

The first step in the detection of an x-ray is the reaction of the x-ray photon through for example photoelectric effect. In case of photoelectric effect an electron in the detector medium absorbs all the energy of the x-ray photon and this energy is transferred to kinetic energy for the electron. In a semiconductor, e.g. like Silicon or Gallium Arsenide or similar the photoelectron will excite electron hole pairs in the conducting and valence bands. The number of created electron-hole pairs will be proportional to the energy of the photoelectron and thus to the energy of the incident x-ray. The standard way to deduce the energy of the incident x-ray is to measure a signal induced from the electron-hole pairs. In a gas as detector medium the number of electron-ion pairs created by the photoelectron will be proportional to the energy.

There are a number of applications where measurement of the energy of x-rays is important. One can mention x-ray fluorescent spectroscopy and weighting of x-ray photons as a function of energy. In medicine so called dual energy imaging has also been proven useful.

It is obvious that it is necessary to collect the full amount of electrons/holes (or electrons/ions in case of gas) to estimate the energy. If a fraction of the electron-hole pairs are not collected the energy for the x-ray will be underestimated. One way of losing electron holes is if they diffuse to adjacent detector pixels before they are collected. This will occur for x-rays converting close to the borderline between two or more detector pixels.

In some applications there are demands on high spatial resolution corresponding to small pixels and high-energy resolution. Since small pixels increases the risk for charge sharing this is in contradiction with obtaining high-energy resolution.

U.S. Pat. No. 5,665,969 describes a x-ray detector, designed to operate as an imaging spectrometer for imaging of a subject. The x-ray detector measures energy of individual x-ray photons in each of a plurality of pixels in the x-ray detector. The pixels of the x-ray detector are readout at a rate such that the likelihood for arrival of more than one x-ray photon in each pixel during a readout period is negligible. Because x-ray photons with different energy levels will create different magnitude responses in the x-ray detector, the measurements made by the x-ray detector can be weighted according to the energy level of the detected x-ray photons. Thus, responses due to noise or x-ray photons, which contribute little or no x-ray attenuation information, can be discarded or weighted to eliminate or reduce their effect on any resulting image. Conversely, measurements due to x-ray photons, which provide significant attenuation information, can be weighted significantly.

According to this patent, the optimal energy weighting one should use is the theoretical optimal one that is approximately proportional to the negative third power of energy. There is nothing mentioned about charge sharing and the optimal weight curve, which can be used in reality.

EP 0 767 389 discloses an X-ray image pickup device having a two-dimensional image reading device, which is constituted by two-dimensionally forming a plurality of photoelectric conversion elements on an insulating substrate. It also has switching elements in the vicinities of these photoelectric conversion elements, a phosphor which is formed on the two-dimensional image reading device and serves as a wavelength converter for converting X-ray radiation into visible light. A grid plate is arranged, which is formed on the phosphor and guides only X-rays from a specific direction toward the phosphor and the two-dimensional image reading device.

A three terminal solid-state ionizing radiation detector, according to U.S. Pat. No. 5,627,377, includes a first layer of a substantially intrinsic Group II-VI compound semiconductor material, such as CdZnTe. The first layer is responsive to incident ionizing radiation for generating electron-hole pairs. The detector further includes a second layer of Group II-VI compound semiconductor material and a third layer of Group II-VI compound semiconductor material that is interposed between first surfaces of the first layer and the second layer. The third layer functions as a grid layer. A first electrical contact is coupled to a second surface of the first layer, a second electrical contact is coupled to a second surface of the second layer, and a third electrical contact is coupled to the third layer for connecting the detector to an external circuit that establishes an electric field across the detector. The electric field causes holes to drift away from the grid layer towards the first contact while electrons drift towards and through the grid layer, through the second layer, and towards the second contact for generating a detectable output signal pulse. Because of the presence of the grid layer only the electrons contribute to the output pulse. The grid layer has a conductivity type such that electrons are a minority charge carrier within the grid layer.

Examples of detectors, on which the present invention can be applied to are disclosed in U.S. Pat. No. 4,937,453 and the pending Swedish Patent Application No. 9900856-7. U.S. Pat. No. 4,937,453 discloses a method and apparatus for detecting x-ray radiation in a radiographic imaging context using so-called "edge-on" detectors. This detector is particularly useful in conjunction with slit and slot scan radiography. In accordance with this invention, detectors are constructed and arranged such that substantially all of the energy from an X-ray to be detected is discharged in the detector. In this way a detector is provided which provides a direct electronic read out, high X-ray stopping power and high spatial resolution while obtaining good signal collection efficiency without the use of excessively high voltage levels. In the preferred embodiment, solid state x-ray detectors are constructed such that the thickness of the detector along the direction of incident x-rays is long enough that substantially all of the x-ray energy is discharged in the detector.

The application No. 9900856-7 refers to a method of obtaining improved radiographic images consisting of orienting a semiconductor radiation detector. The orienting step comprises a selection of an acute angel between the direction of incident radiation and a side of the detector such that the incident radiation mainly hits the side.

FIG. 1 is a schematic illustration of a detector 100 comprising a semiconducting substrate 110 and spatially arranged sensor or electrode strips 120.

Common for these detectors is that stripes of sensors are arranged spaced apart on a silicon substrate and the x-rays being incident onto both the sensors and the space between them.

Swedish Pending Patent Application No. 9903655-0, by the same applicant, relates to a method of detecting a number of photons in an x-ray detecting arrangement comprising a number of spaced apart sensors, said detected photons indirectly creating an amount of free charges proportional to the photon energy. The method comprises weighting said photons by means of signals with respect to possible photon charge-share between at least two adjacent sensors.

SUMMARY OF THE INVENTION

It is the main objective of the present invention to enhance the prior art methods by eliminating charge sharing entirely or partly.

Yet, another essential object of the invention is to present a way to simultaneously obtain high spatial resolution and high-energy resolution for incident x-rays on x-ray detector. Another object of the invention is to extend the photon path in the collimator to absorb the substantially the entire photon energy.

For these reasons the method according to the invention comprises arranging a blocking means between said spaced apart sensors for stopping x-rays that will be incident close to edges of said sensors and will give rise to charge sharing between adjacent sensors. The method further comprises arranging said blocking means directly over the space of said spaced apart sensors or in a distance over the space of said spaced apart sensors. Preferably, the blocking means comprises a blocking material, such as wolfram, copper or any other element or compound with a reasonably high stopping power for x-rays. The blocking means can be produced through etching, or it comprises etched layers adhered together to a blocking layer.

In an assembly for detecting and counting photons in x-ray beams, the invention relates to an arrangement when detecting substantially the entire signal from said photons converting in a detector in an x-ray detecting arrangement comprising a number of spaced apart sensors, said detected photons indirectly creating an amount of free charges proportional to the photon energy. The arrangement comprises a blocking means between said spaced apart sensors for blocking charge sharing between the sensors. Preferably, the blocking means is directly arranged over the space of said spaced apart sensors. It may also be a grid arranged in a distance over the space of said spaced apart sensors. The blocking means may be made of a blocking material, such as wolfram, copper or any other element or compound with a reasonably high stopping power for x-rays. Preferably, said blocking means is produced through etching or it comprises etched layers adhered together to a blocking layer.

BRIEF DESCRIPTION OF THE DRAWINGS

In the following, the invention will be further described in a non-limiting way with reference to the accompanying drawings in which.

DETAILED DESCRIPTION OF EMBODIMENTS

According to the invention, a grid is positioned between the detector and the x-ray source, which stops a large fraction of x-rays that will be incident close to the edge of detector-pixels and thus will give rise to charge sharing between adjacent pixels. In applications in which energy weighting is significant, the charge sharing is reduced or eliminated by preventing the influence of charges penetrating from one x-ray sensor to an another, adjacent sensor(s). It is achieved by covering the space between the sensors with a material, which block x-ray flow, such as a screen made of wolfram, copper or any other element or compound with a reasonably high stopping power for x-rays.

Figure 1:
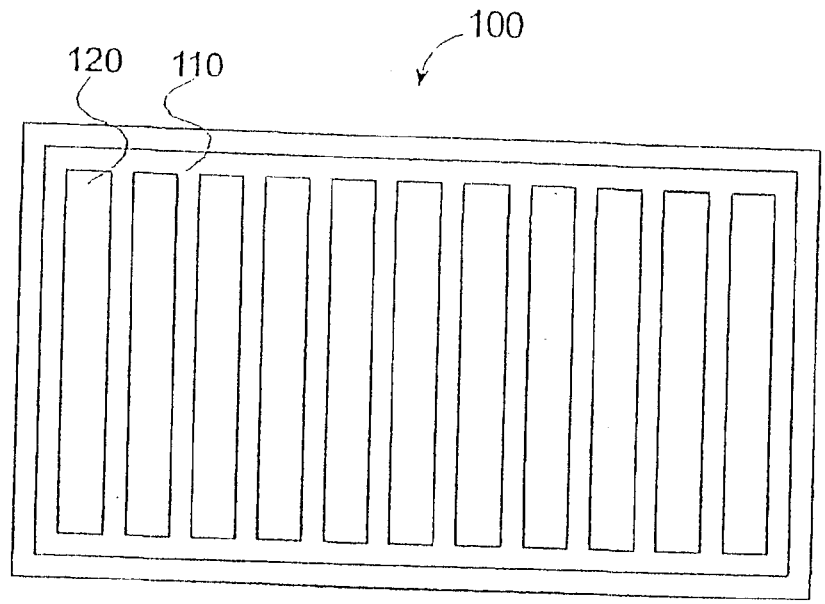
FIG. 1 schematically illustrates a prior art detector arrangement for detecting x-rays.

A decoder 100 according to the prior art is illustrated in FIG. 1. The decoder comprises a carrier substrate 110, on which a number of spaced apart sensor strips 120 are arranged. The sensor strips 120 consists of semiconducting material and configuration as described in above-mentioned U.S. Pat. No. 4,937,453 and the pending Swedish Patent Application No. 9900856-7.

Figure 2:
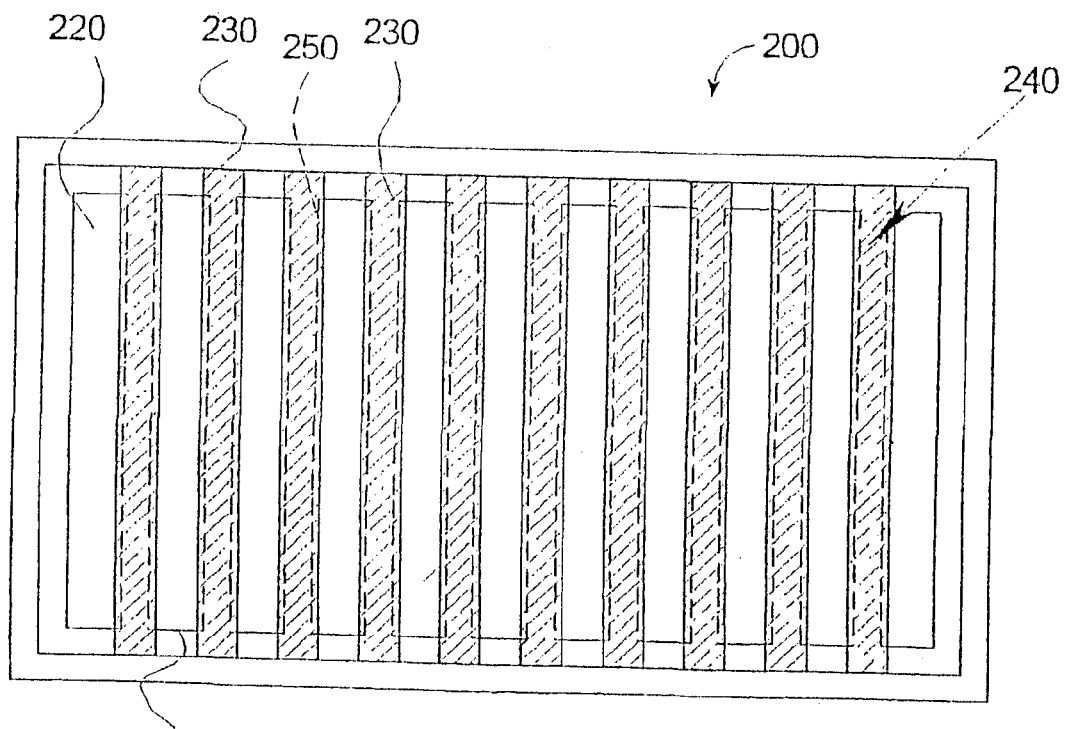
FIG. 2 is a schematic illustration of detector arrangement employing the present invention.

FIG. 2 shows a detector arrangement 200 employing the teachings of the invention. The detector has the same structure similar to the one shown in FIG. 1. The detector 200 comprises a number of space apart sensor strips 220 arranged on a substrate 210. According to the invention a blocking arrangement, provided as strips 230, covers the space 240 between two sensor strips 220. The blocking strip also covers parts of the sensor strips. The covered edge-sections 250 of a sensor strip under each blocking strip is indicated with dashed lines.

The blocking strips are made of a blocking material such as wolfram, lead etc., and can be arranged as adhesive strips, directly on the sensors.

Figure 3:
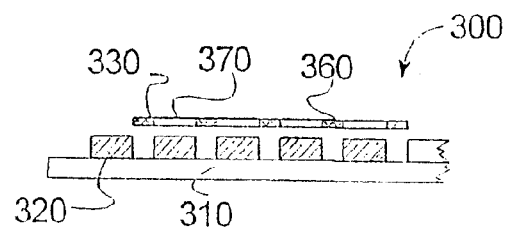
FIG. 3 is another cross-section through another embodiment according to the invention.

However, as shown in FIG. 3, the blocking strips 330 can be arranged in a distance from the sensor strips 320 of the detector 300. In this case the blocking strips are parts of blocking arrangement 360 provided with slits 370.

Figure 4:
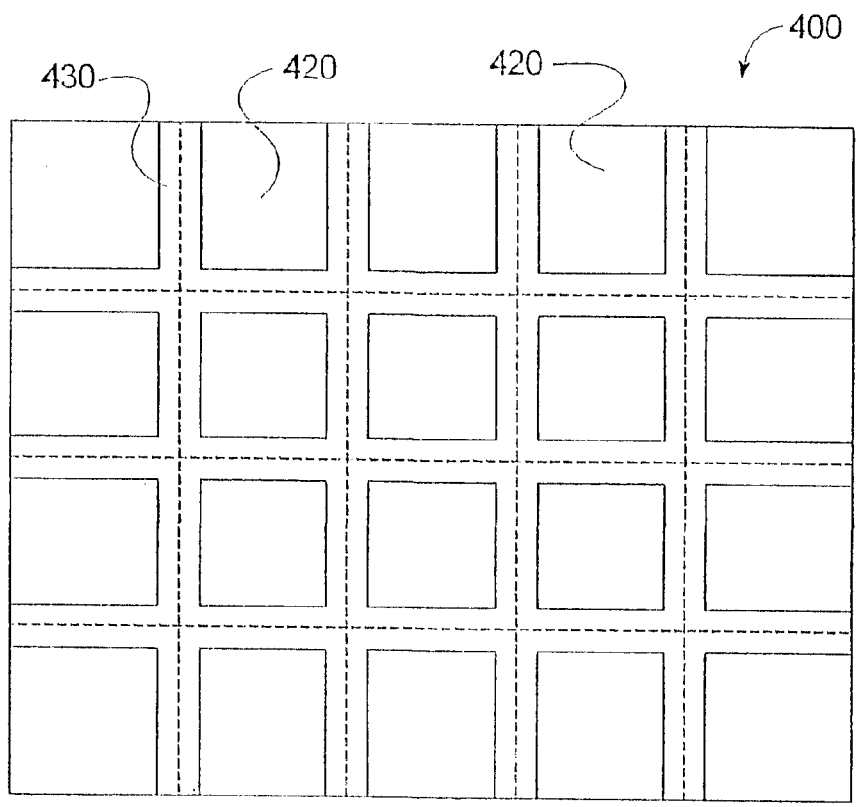
FIG. 4 is another embodiment according to the present invention.
Figure 5:
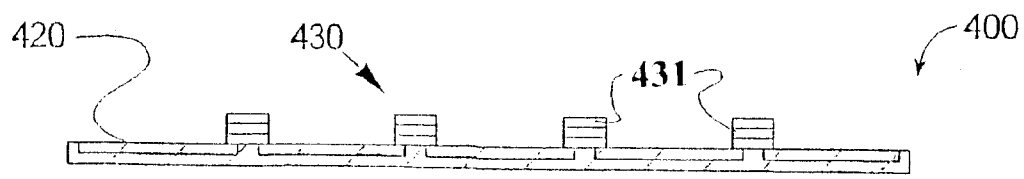
FIG. 5 is a cross-section through the embodiment according to FIG. 4.

In a most preferred embodiment, as illustrated in FIGS. 4 and 5, the detector assembly 400 comprises an array of sensor electrodes 420. The electrodes are produced through a known semiconductor fabrication method. The electrodes are further connected to Application Specific Integrated Circuits (ASICS) through wire bonding, bump bonding etc., and these ASICs are suited for pulse analysis. In this case, the blocking layer 430 is applied onto the sensor borders. The blocking layer can be made by means of etching layers 431 directly on the detector assembly, if the blocking layer is first attached to the detector. Alternatively, the blocking layer can be made separately and attached to the detector afterwards to cover the area between the pixels. The blocking layer could then be fabricated using a number of thin layers produced through etching, which then are composed to one layer having desired thickness.

The method of producing blocking elements according to the fourth embodiment can also be sued for producing blocking elements used in preceding embodiments. The blocking means can thus be made of etched and composed layers arranged in distance from the detectors.

One drawback with the invention is that some of the x-rays are not used at all in forming the image. For several applications however this is beneficial since those x-rays would make the measurement of the energy of the incoming x-rays uncertain and thus deteriorate the information.

It is possible also to build advanced anti coincidence electronics to cope with charge sharing events, as described in for example the pending Swedish application no. 9903655-0 for the same applicant, this is however not trivial and at very high rates of incoming x-rays it may even be impossible.

The invention is not limited the shown and described embodiments and can be varied in a number of ways without departing from the scope of the appended claims. The arrangement and the method can be implemented in various ways depending on application, functional units, needs and requirements etc.

What is claimed is:

1. A method for detecting substantially an entire signal from a photon that is converting in a detector in an X-ray detecting arrangement, said arrangement comprising a photon converting device and a photon detecting device and a number of spaced-apart sensors, said detected photons indirectly creating an amount of free charges proportional to the photon energy, characterized by arranging a blocking means between said spaced-apart sensors for stopping X-rays that will be incident close to edges of said sensors and that would otherwise give rise to charge sharing between adjacent sensors, said blocking means being produced through etching layers combined together to form a blocking layer.

2. The method according to claim 1, characterized in that the blocking means is positioned directly over the space between said spaced-apart sensors.

3. The method according to claim 2, characterized in that said blocking means comprises tungsten or copper.

4. The method according to claim 1, characterized in that the blocking means is positioned at a distance over the space between said spaced-apart sensors.

5. The method according to claim 4, characterized in that said blocking means comprises tungsten or copper.

6. The method according to claim 1,
characterised in
that said etched layers (431) are adhered together.

7. The method according to claim 1, characterized in that said blocking means comprises tungsten or copper.

8. In an assembly for detecting and counting photons in x-ray beams, an arrangement when detecting substantially the entire signal from said photons converting in a detector in an x-ray detecting arrangement (200, 300, 400) comprising a number of spaced apart sensors (220, 320, 420), said detected photons indirectly creating an amount of free charges proportional to the photon energy
characterised in
that said arrangement comprises a blocking means (230, 330, 430) between said spaced apart sensors for blocking charge sharing between the sensors, said blocking means comprising etched layers (431) composed together to a blocking layer.

9. The arrangement according to claim 8, characterized in that said blocking means is positioned directly over the space between said spaced-apart sensors.

10. The method according to claim 9, characterised in that said blocking means comprises tungsten or copper.

11. The arrangement according to claim 8, characterized in that said blocking means is a grid positioned at a distance over the space between said spaced-apart sensors.

12. The method according to claim 11, characterized in that said blocking means comprises tungsten or copper.

13. The method according to claim 8,
characterised in
that said etched layers are adhered together.

14. The method according to claim 8, characterised in that said blocking means comprises tungsten or copper.

15. An assembly for detecting and counting photons in X-ray beams, the assembly comprising a number of spaced-apart sensors, said detected photons indirectly creating an amount of free charges proportional to the photon energy, the assembly further comprising a blocking means, produced through etching layers, between said spaced-apart sensors for blocking charge sharing between the sensors.

16. The arrangement according to claim 15, characterized in that said blocking means is positioned directly over the space between said spaced-apart sensors.

17. The arrangement according to claim 15, characterized in that said blocking means is a grid positioned at a distance over the space between said spaced-apart sensors.

18. The method according to claim 15, characterized in that said blocking means comprises tungsten or copper.

* * * * *